(12) United States Patent
Hsu et al.

(10) Patent No.: US 10,037,915 B1
(45) Date of Patent: Jul. 31, 2018

(54) FABRICATING METHOD OF A SEMICONDUCTOR STRUCTURE WITH AN EPITAXIAL LAYER

(71) Applicant: UNITED MICROELECTRONICS CORP., Hsin-Chu (TW)

(72) Inventors: Te-Chang Hsu, Tainan (TW); Chun-Chia Chen, Tainan (TW); Yao-Jhan Wang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/700,171

(22) Filed: Sep. 10, 2017

(51) Int. Cl.
*H01L 21/8234* (2006.01)
*H01L 29/78* (2006.01)

(52) U.S. Cl.
CPC ........ *H01L 21/823418* (2013.01); *H01L 21/823437* (2013.01); *H01L 21/823468* (2013.01); *H01L 29/7848* (2013.01)

(58) Field of Classification Search
CPC .............................................. H01L 21/823418
See application file for complete search history.

(56) References Cited

U.S. PATENT DOCUMENTS

| | | | |
|---|---|---|---|
| 8,866,230 B2 | 10/2014 | Tung |
| RE45,462 E | 4/2015 | Mori |
| 9,013,003 B2 | 4/2015 | Liang |
| 9,312,258 B2 | 4/2016 | Hwang |
| 9,634,002 B1 | 4/2017 | Tsai |
| 2011/0291201 A1 | 12/2011 | Cheng |

OTHER PUBLICATIONS

Yen-Liang Wu et al., "Multi Epi2G fabrication", Invention Disclosure, May 12, 2017, p. 1-14.

*Primary Examiner* — Marvin Payen
(74) *Attorney, Agent, or Firm* — Winston Hsu

(57) ABSTRACT

A fabricating method of a semiconductor structure includes providing a substrate divided into a dense region and an isolated region, wherein a first gate structure is disposed within the dense region, and a second gate structure is disposed within the isolated region. Then, a first material layer is formed to cover the first gate structure, the second gate structure and the substrate. Later, a second material layer is formed to cover the first material layer. After that, the second material layer within the dense region is entirely removed. Subsequently, a third material layer is formed to cover the isolated region and the dense region. Next, the substrate is etched to form a first recess at two sides of the first gate structure, and a second recess at two sides of the second gate structure. Finally, an epitaxial layer is formed to fill the first recess and the second recess.

9 Claims, 6 Drawing Sheets

US 10,037,915 B1

FABRICATING METHOD OF A SEMICONDUCTOR STRUCTURE WITH AN EPITAXIAL LAYER

BACKGROUND OF THE INVENTION

1. Field of the Invention

The present invention relates a fabricating method of a semiconductor structure with an epitaxial layer; and more particularly to a fabricating method of a semiconductor structure having an epitaxial layer farther from a gate structure within an isolated region and nearer to a gate structure within a core region.

2. Description of the Prior Art

With the development of integrated circuits technology, device feature size is becoming smaller, and low electron and hole mobility in bulk silicon material has become the bottleneck of enhancing device performance. Strained silicon is formed by epitaxially growing silicon on materials that have a different lattice constant from silicon. Because strained silicon can effectively improve carrier mobility, it has become a candidate substrate material for semiconductor technology nodes of the next generation. For example, as an epitaxial layer such as SiGe has a different lattice constant from Si, there will be a lattice mismatch between a SiGe substrate and epitaxial Si grown thereon, and such a lattice mismatch will induce strain in an epitaxial Si layer. Due to this lattice structure distortion, a strained silicon material can simultaneously enhance electron and hole mobility.

Higher strain is needed in a dense region and lower strain is needed in an isolated region. These criteria have increased the complexity of processing and manufacturing ICs.

SUMMARY OF THE INVENTION

In light of the above, it is one objective of the present invention to provide a method for fabricating a semiconductor structure having different channel strains within a dense region and within in an isolated region.

According to a preferred embodiment of the present invention, a fabricating method of a semiconductor structure with an epitaxial layer comprises providing a substrate divided into a dense region and an isolated region, wherein a first gate structure is disposed within the dense region, and a second gate structure is disposed within the isolated region. A first material layer is formed to cover the first gate structure, the second gate structure and the substrate. Later, a second material layer is formed to cover the first material layer. After that, the second material layer within the dense region is entirely removed. Subsequently, after removing the second material layer within the dense region, a third material layer is formed to cover the second material layer within the isolated region, and the first material layer within the dense region. Next, the substrate is etched to form a first recess at two sides of the first gate structure, and a second recess at two sides of the second gate structure by taking the first gate structure, the second gate structure, the first material layer, the second material layer and the third material layer as a first mask. Finally, an epitaxial layer is formed to fill the first recess and the second recess.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 12 depict a fabricating method of a semiconductor structure with an epitaxial layer according to a preferred embodiment of the present invention, wherein:
FIG. 1 depicts a substrate with numerous fins;
FIG. 2 is a fabricating stage following FIG. 1;
FIG. 3 is a fabricating stage following FIG. 2;
FIG. 4 is a fabricating stage following FIG. 3;
FIG. 5 is a fabricating stage following FIG. 4;
FIG. 6 is a fabricating stage following FIG. 5;
FIG. 7 is a fabricating stage following FIG. 6;
FIG. 8 is a fabricating stage following FIG. 7;
FIG. 9 is a fabricating stage following FIG. 8;
FIG. 10 is a fabricating stage following FIG. 9;
FIG. 11 is a fabricating stage following FIG. 10; and
FIG. 12 is a fabricating stage following FIG. 11.

DETAILED DESCRIPTION

FIG. 1 to FIG. 12 depict a fabricating method of a semiconductor structure with an epitaxial layer according to a preferred embodiment of the present invention.

Figure 1:
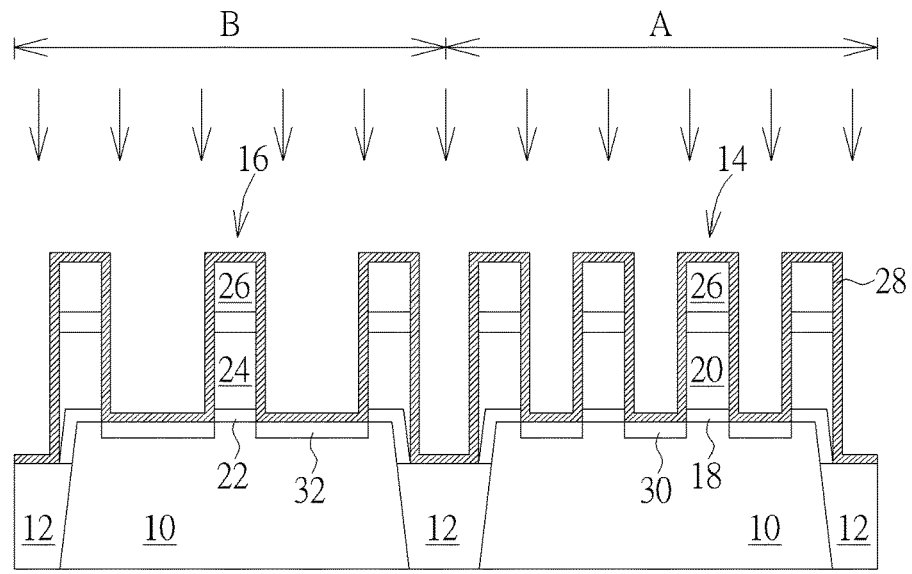

As shown in FIG. 1, a substrate 10 is provided. The semiconductor substrate 10 of the present invention is a bulk silicon substrate, a germanium substrate, a gallium arsenide substrate, a silicon germanium substrate, an indium phosphide substrate, a gallium nitride substrate, a silicon carbide substrate, or a silicon on insulator (SOI) substrate. The substrate 10 may be a planar substrate or fins. The substrate 10 is divided into a dense region A and an isolated region B. Shallow trench isolations 12 are disposed in the substrate 10 to define active regions. The dense region A may be a core region which has a higher element density, and the isolated region B may be an Input/Output (I/O) region which has a lower element density. At least a first gate structure 14 is disposed within the dense region A, and at least a second gate structure 16 is disposed within the isolated region B. This embodiment shows numerous first gate structures 14 and numerous second gate structures 16 as an example. Each of the first gate structures 14 includes a sacrificial oxide layer 18 and a dummy gate 20. Each of the second gate structures 16 includes a gate oxide layer 22 and a polysilicon gate 24. Each of the first gate structures 14 and the second gate structures 16 can further include a cap layer 26. Later, a first material layer 28 is formed to conformally cover the first gate structures 14, the second gate structures 16 and the substrate 10. The first material layer 28 may be SiN, SiCN or SiOCN. In this embodiment, the first material layer 28 is preferably SiOCN. Later, a first implantation process is performed by implanting first dopants into the substrate 10 to form first lightly doped regions 30 at two sides of the first gate structures 14, and second lightly doped regions 32 at two sides of the second gate structures 16 by using the first material layer 28, the first gate structures 14 and the second gate structures 16 as a mask. Based on the conductivity type of the transistors formed afterwards, the first dopants can be N type or P type. In this embodiment, the transistors formed afterwards are P-type. Therefore, first dopants are P-type dopants such as boron or gallium. In other embodiment, the transistors formed afterwards can be N-type, and phosphorus or arsenic is implanted in this step.

Figure 2:
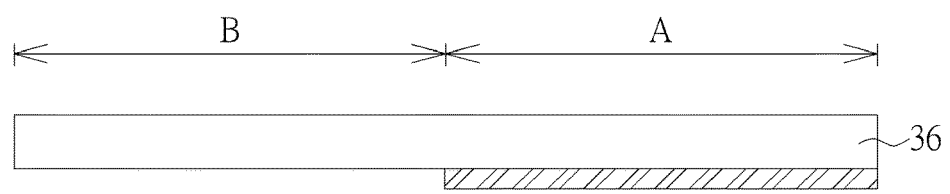
Figure 2:
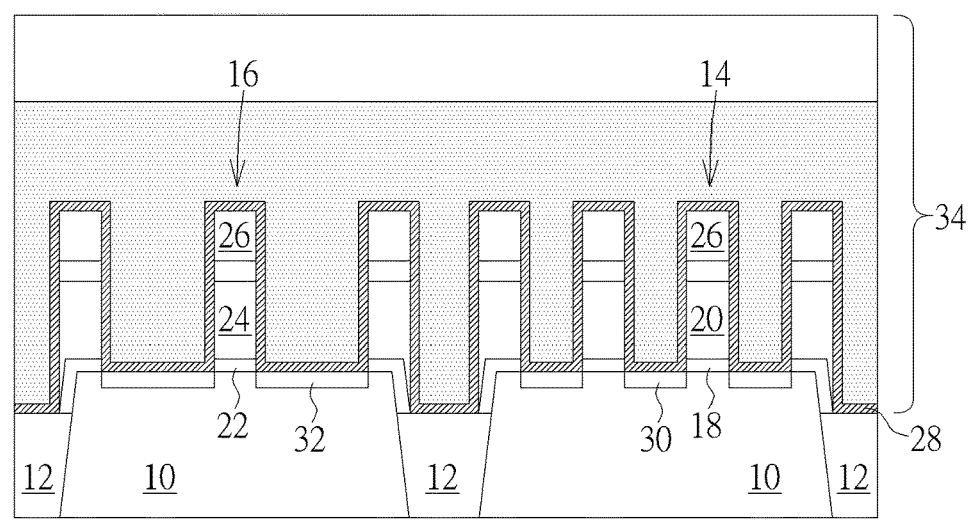
Figure 3:
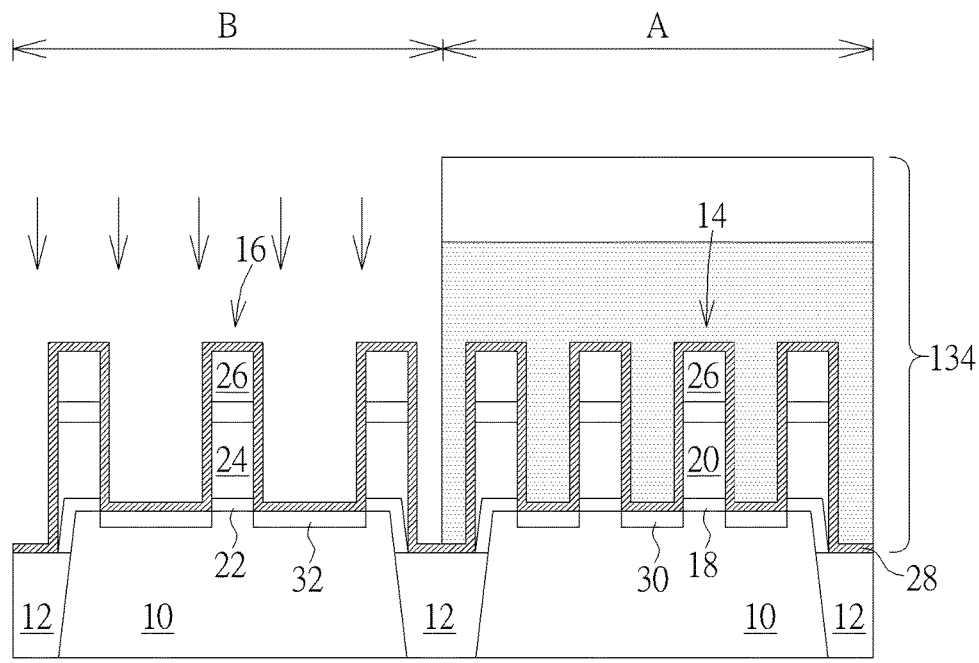

As shown in FIG. 2, a covering layer 34 is formed to cover the isolated region B, the dense region A, the first gate structures 14 and the second gate structures 16. Later, a first photo mask 36 is used to expose the covering layer 34 through an exposure process. As shown in FIG. 3, an etching process is performed and patterns on the first photo mask 36 are transferred onto the covering layer 34 to transform the covering layer 34 into a patterned layer 134. In detail, the covering layer 34 on the isolated region B and the second gate structures 16 is removed, and the covering layer 34 becomes the patterned Layer 134.

After that, a second implantation process is performed by implanting second dopants into the substrate 10 at two sides of the second gate structures 16 by using the patterned layer 134 as a mask. In detail, the second dopants are implanted into the isolated region B to adjust the threshold voltage of the transistors formed afterwards within the isolated region B. The second dopants may be P-type or N-type dopants.

Figure 4:
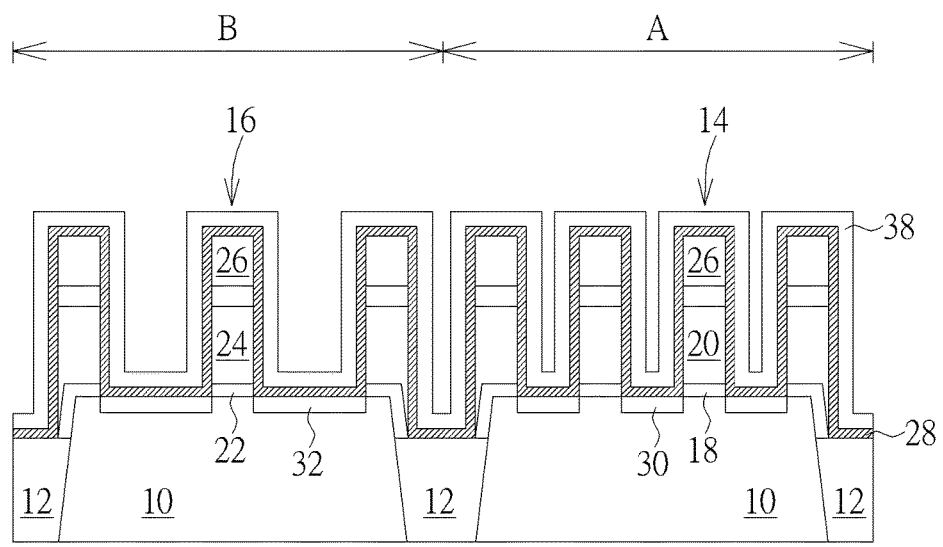
Figure 5:
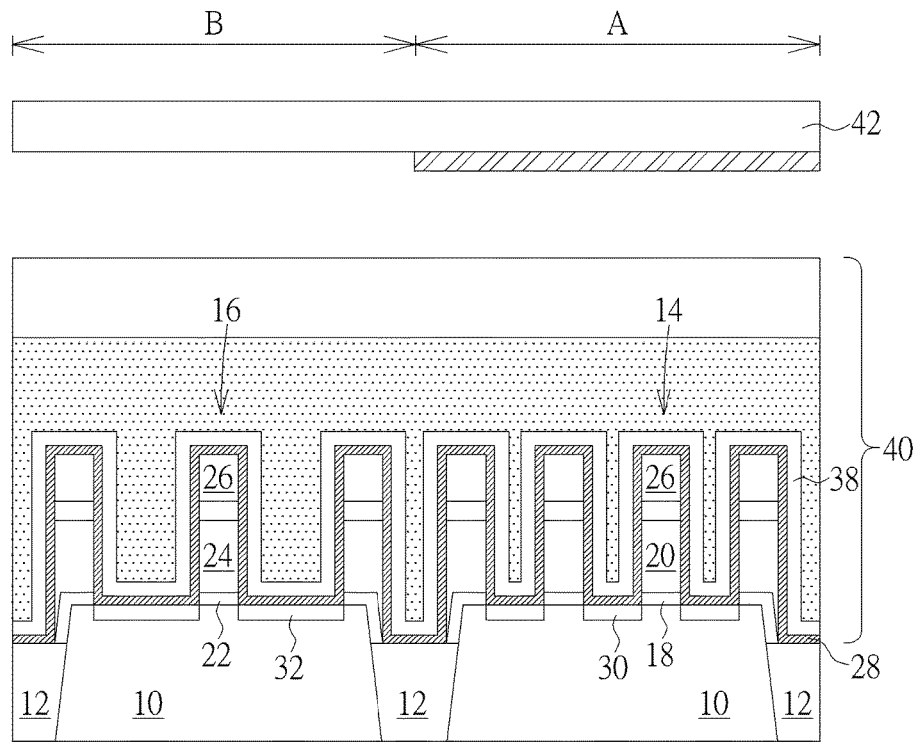
Figure 6:
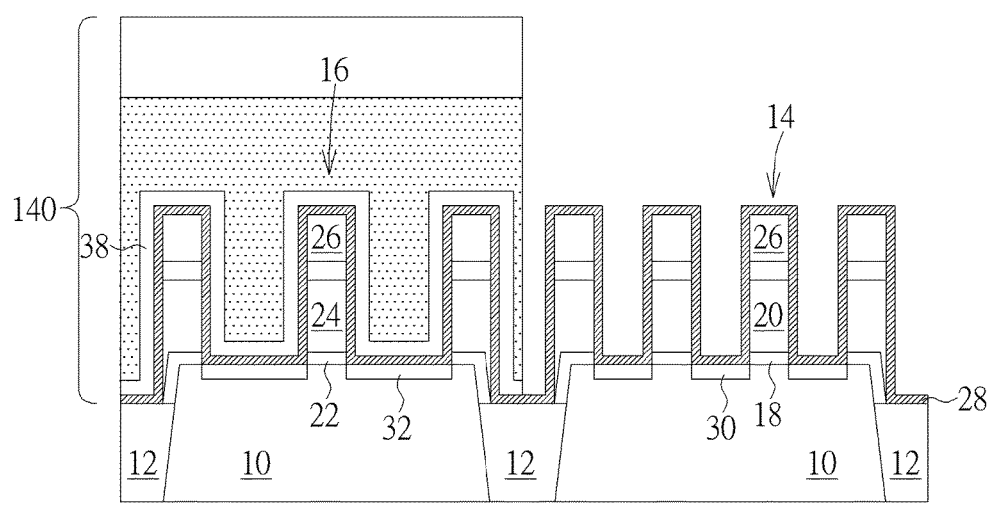

As shown in FIG. 4, the patterned layer 134 is entirely removed. Next, a second material layer 38 is conformally formed to cover the first material layer 28. The second material layer 38 may be SiN, SiCN or SiOCN. Moreover, the first material layer 28 and the second material layer 38 are different. According to a preferred embodiment of the present invention, the first material layer 28 is SiOCN and the second material layer 38 is SiN. As shown in FIG. 5, a covering layer 40 is formed to cover the dense region A, the isolated region B, the first gate structures 14 and the second gate structures 16. Then, the covering layer 40 is exposed by using a second photo mask 42 through an exposure process. As shown in FIG. 6, the covering layer 40 is patterned by removing the covering layer 40 on the dense region A and the first gate structures 14 and transforming the covering layer 40 into a patterned layer 140. At this point, the dense region A is exposed. Subsequently, the second material layer 38 within the dense region A is entirely removed, and the first material layer 28 within the dense region B remains.

Figure 7:
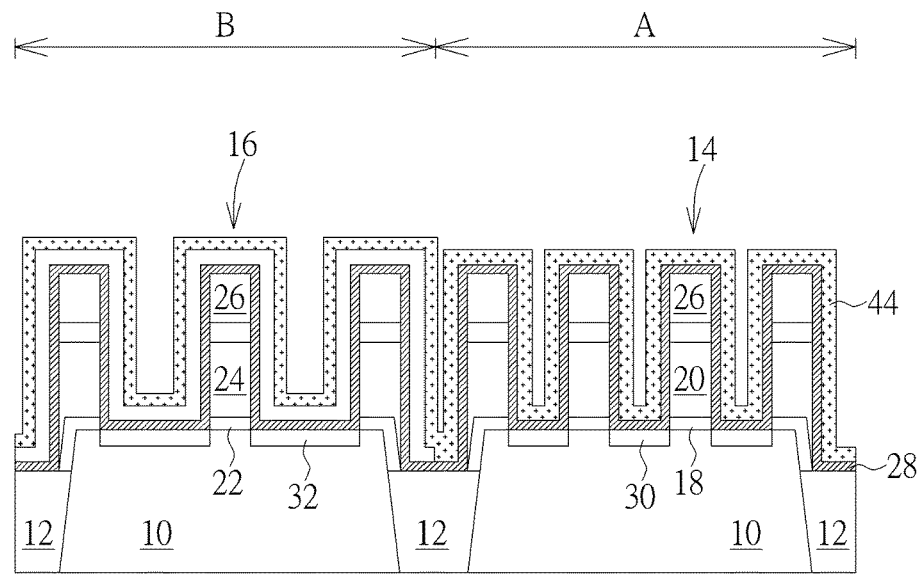

As shown in FIG. 7, the patterned layer 140 is removed entirely. Later, a third material layer 44 is formed to cover the second material layer 38 within the isolated region B, and the first material layer 28 within the dense region A. At this point, there are three material layers covering the second gate structures 16 within the isolated region B, and two material layers covering the first gate structures 14 within the dense region B. The third material layer 44 may be SiOCN, SiCN, or SiN.

Figure 8:
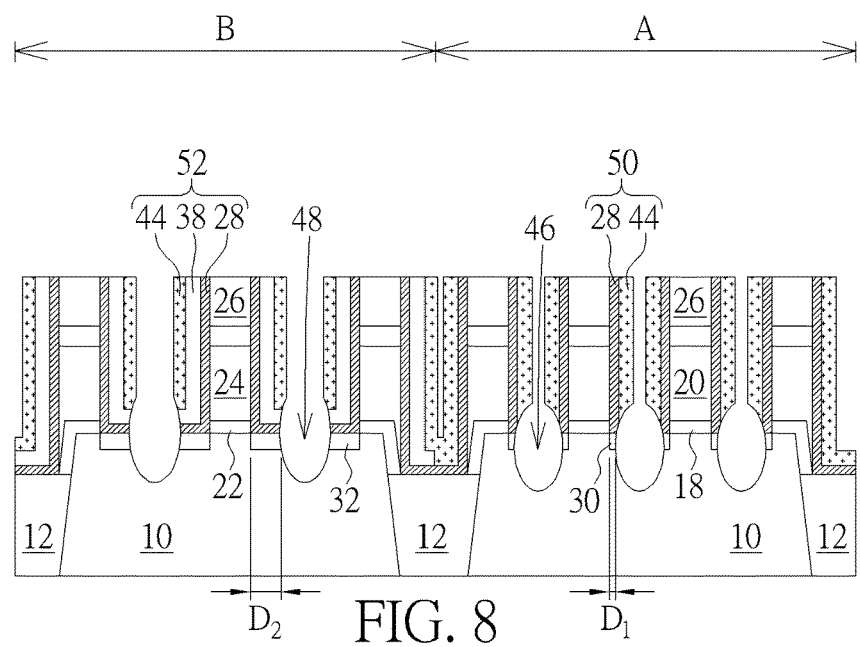

As shown in FIG. 8, an etching process is performed to etch the substrate 10 to form a first recess 46 at two sides of each of the first gate structures 14, and a second recess 48 at two sides of each of the second gate structures 16 by taking the first gate structures 14, the second gate structures 16, the first material layer 28, the second material layer 38 and the third material layer 44 as mask. While etching the substrate 10 to form the first recess 46 and the second recess 48, the first material layer 28 and the third material layer 44 on the first gate structures are also etched to form a first spacer 50, and the first material layer 22, the second material layer 38 and the third material layer 44 on the second gate structures 16 are also etched to form a second spacer 52. A thickness of the first spacer 50 is less than a thickness of the second spacer 52, because the first spacer 50 is made of the first material layer 28 and the third material layer 44, and the second spacer 52 is made of the first material layer 28, the second material layer 38 and the third material layer 44. Because the first recess 46 and the second recess 48 are formed by self-aligning the first spacer 50 and the second spacer 52 during the etching process and the second spacer 52 is thicker than the first spacer 50, a distance $D_1$ between the first recess 46 and the adjacent first gate structure 14 is smaller than a distance $D_2$ between the second recess 48 and the adjacent second gate structure 16.

Figure 9:
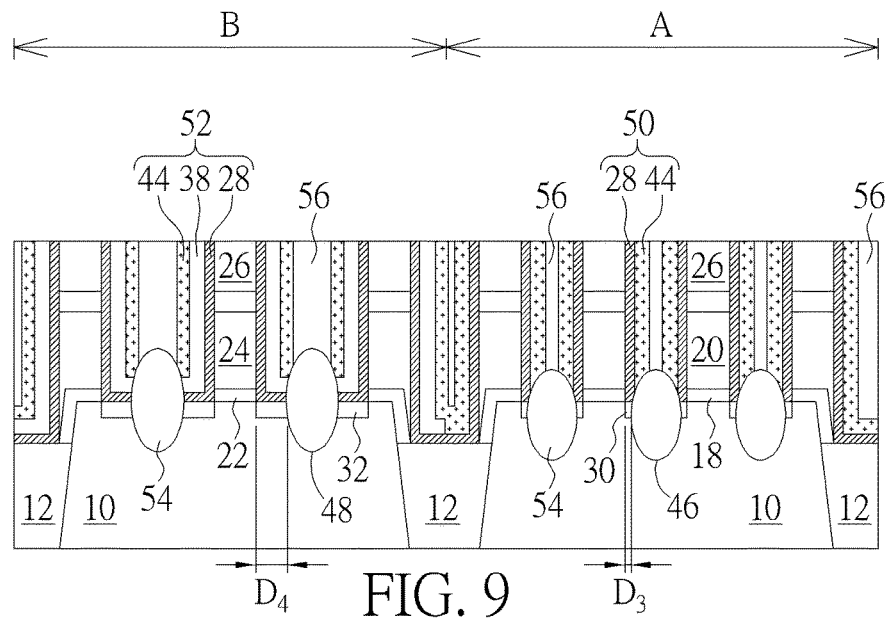
Figure 10:
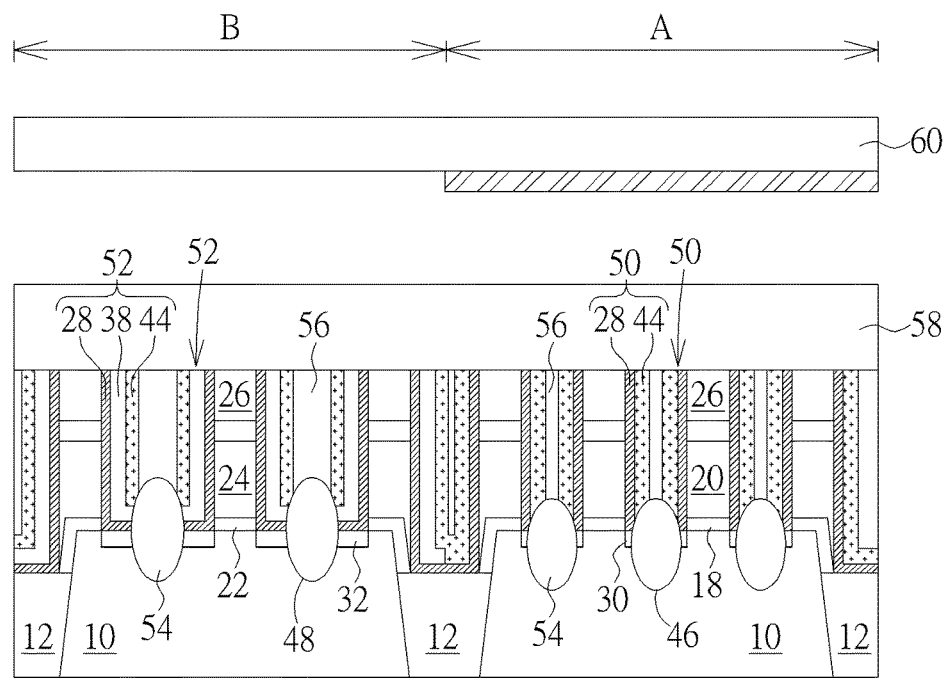

As shown in FIG. 9, an epitaxial layer 54 is formed to fill the first recess 46 and the second recess 48. There is a distance $D_3$ between the epitaxial layer 54 in the first recess 46 and the first gate structure 14 adjacent to the first epitaxial layer 54 in the first recess 46. There is a distance $D_4$ between the epitaxial layer 54 in the second recess 48 and the second structure 16 adjacent to the epitaxial layer 54 in the second recess 48. The distance $D_3$ is smaller than the distance $D_4$. The difference between the distance $D_3$ and the distance $D_4$ is the thickness of the second material layer 38.

Figure 11:
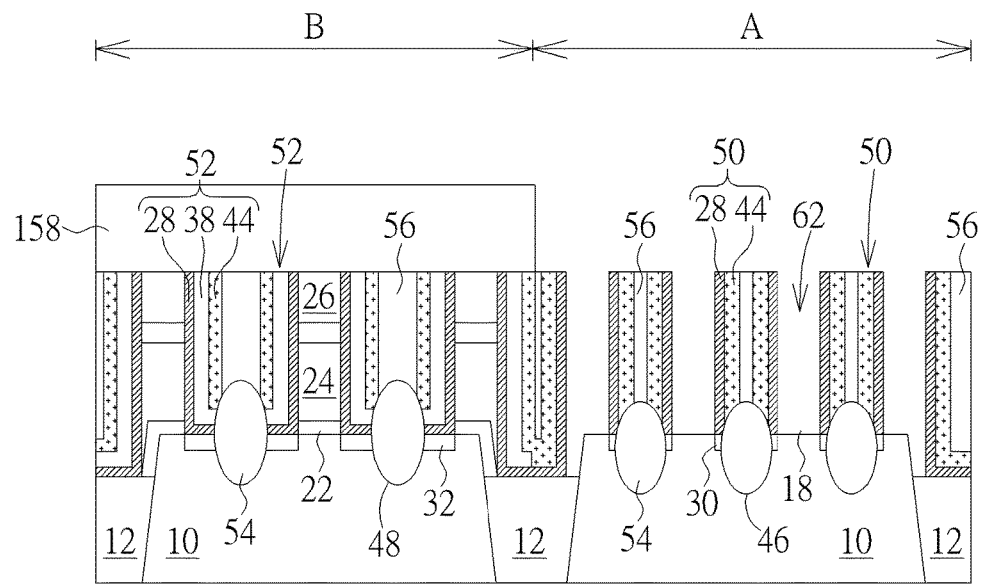
Figure 12:
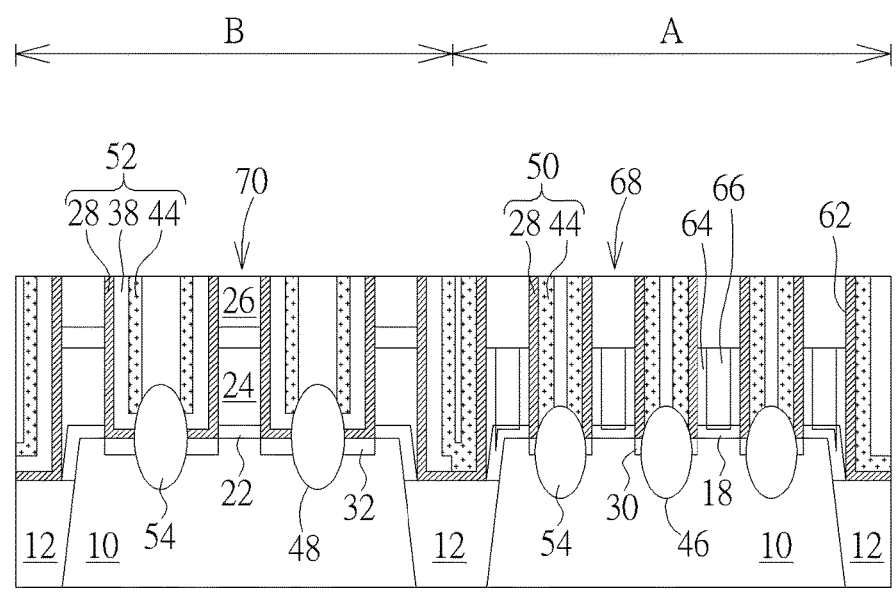

If the transistors formed afterwards are P-type, the epitaxial layer may be SiGe, and if the transistors formed afterwards are N-type, the epitaxial layer may be SiC or SiP. Later, an interlayer dielectric layer 56 is formed to cover the substrate 10, the first gate structures 14 and the second gate structures 16. Then, the interlayer dielectric layer 56 is etched back to make the top surface of the interlayer dielectric layer 56 aligned with the top surface of the first gate structures 14. Subsequently, a covering layer 58 is formed to cover the dense region A, the isolated region B, the first gate structures 14 and the second gate structures 16. Then, the covering layer 58 is exposed by a third photo mask 60 through an exposure process. As shown in FIG. 11, the covering layer 58 is patterned by removing the covering layer 58 on the dense region A and transforming the covering layer 58 into a patterned layer 158. At this point, the dense region A is exposed. Next, the sacrificial oxide layer 18 and the dummy gate 20 are removed to form a third recess 62. As shown in FIG. 12, a gate oxide 64 and a metal gate 66 are formed to fill in the third recess 62. A cap layer may cover the metal gate 66. Later, the patterned layer 158 is removed. At this point, the transistors 68 in the dense region A and the transistors 70 in the isolated region B are completed. As mentioned above, the transistors 68/70 in this embodiment are P-type; however, according to different embodiments, the transistors 68/70 can be N-type, or the transistors 68/70 can be separated into N-type or P-type.

According to a preferred embodiment of the present invention, the second photo mask 42 and the third photo mask 60 are the same photo mask. This means that the steps of removing the second material layer 38 within the dense region A do not need an extra photo mask. The third photo mask 60 originally used to separate the dense region A and the isolated region B when exposing the dense region A to remove the dummy gates 20 can be applied to the steps of removing the second material layer 38 within the dense region A. Furthermore, if the N-type transistors and P-type transistors are fabricated in the present invention, both the dense region A of N-type transistors and the dense region A of P-type transistors can be separate from the isolated region B by using the third photo mask 60. If P-type transistors and N-type transistors are manufactured simultaneously in the substrate 10, the third photo mask 60 can be used to remove the second material layer 38 of the P-type and N-type transistors within the dense region A.

According to yet another preferred embodiment of the present invention, the second photo mask 42 and the first photo mask 36 are the same photo mask. This means that the steps of removing the second material layer 38 within the dense region A do not need an extra photo mask. The first photo mask 36 originally used to separate the dense region A and the isolated region B when exposing the isolated region B in order to adjust the threshold voltage can be applied to the steps of removing the second material layer 38 within the dense region A. Furthermore, N-type transistors and P-type transistors use two different second photo masks, because the threshold voltages for N-type transistors and P-type transistor are different. If only the dense region A of the P-type transistors needs to be exposed in order to remove the dummy gates 20 and the sacrificial oxide layer 18, the first photo mask for P-type transistors is applied. If the dense region A of the N-type transistors needs to be exposed in order to remove the dummy gates 20 and the sacrificial oxide layer 18, the first photo mask for N-type transistors is applied.

One of the features in the present invention is that the first spacer 50 and the second spacer 52 of the present invention are formed simultaneously by the etching process. Moreover, the second material layer 38 within the dense region A is removed before forming the first spacer 50; therefore, the first spacer 50 is thinner than the second spacer 52. In the end, the distance $D_4$ between the epitaxial layer 54 and the second gate structure 16 adjacent to the epitaxial layer 54 is greater than the distance $D_3$ between the epitaxial layer 54 and the first gate structure 14 adjacent to the epitaxial layer 54. Channel strain of each of the second gate structures 16 is therefore smaller than channel strain of each of the first gate structures 14.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fabricating method of a semiconductor structure with an epitaxial layer, comprising:
    providing a substrate comprising a dense region and an isolated region, wherein a first gate structure is disposed within the dense region, and a second gate structure is disposed within the isolated region;
    forming a first material layer covering the first gate structure, the second gate structure and the substrate;
    forming a second material layer covering the first material layer;
    entirely removing the second material layer within the dense region;
    after removing the second material layer within the dense region, forming a third material layer covering the second material layer within the isolated region, and the first material layer within the dense region;
    etching the substrate to form a first recess at two sides of the first gate structure, and a second recess at two sides of the second gate structure by taking the first gate structure, the second gate structure, the first material layer, the second material layer and the third material layer as a first mask;
    forming an epitaxial layer filling the first recess and the second recess; and
    before removing the second material layer within the dense region, forming a first covering layer covering the dense region, the isolated region, the first gate structure and the second gate structure;
    patterning the first covering layer by removing the first covering layer on the dense region and on the first gate structure and transforming the first covering layer into a first patterned layer by using a first photo mask;
    removing the second material layer within the dense region by using the first patterned layer as a second mask; and
    removing the first patterned layer.

2. The fabricating method of a semiconductor structure with an epitaxial layer of claim 1, further comprising:
    before forming the second material layer and after forming the first material layer, performing a first implantation process by implanting first dopants into the substrate to form first lightly doped regions at two sides of the first gate structure, and second lightly doped regions at two sides of the second gate structure by using the first material layer, the first gate structure and the second gate structure as a third mask;
    forming a second covering layer covering the dense region, the isolated region, the first gate structure and the second gate structure;
    patterning the second covering layer by removing the second covering layer on the isolated region and on the second gate structure and transferring the second covering layer into a second patterned layer by using the first photo mask;
    performing a second implantation process by implanting second dopants into the substrate at two sides of the second gate structure by using the second patterned layer as a fourth mask; and
    removing the second patterned layer.

3. The fabricating method of a semiconductor structure with an epitaxial layer of claim 1, wherein the first gate structure comprises a sacrificial oxide layer and a dummy gate.

4. The fabricating method of a semiconductor structure with an epitaxial layer of claim 3, further comprising
    after forming the epitaxial layer, forming a dielectric layer covering the substrate, the first gate structure and the second gate structure;
    forming a third covering layer covering the dense region, the isolated region, the first gate structure and the second gate structure;
    patterning the third covering layer by removing the third covering layer on the dense region and transferring the third covering layer into a third patterned layer by using the first photo mask;
    removing the sacrificial oxide layer and the dummy gate to form a third recess; and
    forming a gate oxide and a metal gate filling in the third recess.

5. The fabricating method of a semiconductor structure with an epitaxial layer of claim 1, wherein the first material layer and the second material layer are different materials.

6. The fabricating method of a semiconductor structure with an epitaxial layer of claim 1, wherein while etching the substrate to form the first recess and the second recess, the first material layer and the third material layer on the first gate structure are etched to form a first spacer, and the first material layer, the second material layer and the third material layer on the second gate structure are etched to form a second spacer.

7. The fabricating method of a semiconductor structure with an epitaxial layer of claim 6, wherein a thickness of the first spacer is less than a thickness of the second spacer.

8. The fabricating method of a semiconductor structure with an epitaxial layer of claim 1, wherein a distance between the epitaxial layer in the first recess and the first gate structure is smaller than a distance between the epitaxial layer in the second recess and the second structure.

9. The fabricating method of a semiconductor structure with an epitaxial layer of claim 1, wherein the dense region is a core region and the isolated region is an Input/Output (I/O) region.

* * * * *